United States Patent
Gu et al.

(10) Patent No.: US 10,879,332 B2
(45) Date of Patent: Dec. 29, 2020

(54) DISPLAY APPARATUS

(71) Applicant: SAMSUNG DISPLAY CO., LTD., Yongin-si (KR)

(72) Inventors: Bonseog Gu, Yongin-si (KR); Woomi Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 122 days.

(21) Appl. No.: 15/618,211

(22) Filed: Jun. 9, 2017

(65) Prior Publication Data

US 2017/0372661 A1 Dec. 28, 2017

(30) Foreign Application Priority Data

Jun. 23, 2016 (KR) .................. 10-2016-0078619

(51) Int. Cl.
*H01L 27/32* (2006.01)

(52) U.S. Cl.
CPC ..... *H01L 27/3276* (2013.01); *G09G 2310/08* (2013.01)

(58) Field of Classification Search
CPC .................. H01L 27/3276; G09G 2310/08
See application file for complete search history.

(56) References Cited

U.S. PATENT DOCUMENTS

| | | | |
|---|---|---|---|
| 6,903,717 B2* | 6/2005 | Takahashi | G02F 1/1345 345/100 |
| 7,079,093 B2* | 7/2006 | Sun | H01L 27/3244 313/293 |
| 7,499,019 B2* | 3/2009 | Lee | G09G 3/3648 345/1.1 |
| 7,593,086 B2* | 9/2009 | Jeong | H01L 27/3276 349/149 |
| 7,812,785 B2* | 10/2010 | An | G02F 1/13452 345/1.1 |
| 8,604,691 B2 | 12/2013 | Seo et al. | |
| 8,866,697 B2* | 10/2014 | Jung | G06F 1/1616 345/1.1 |
| 9,379,139 B2* | 6/2016 | Jeon | G02F 1/13452 |
| 2005/0156811 A1* | 7/2005 | Ikeda | G06F 3/147 345/1.1 |
| 2005/0174299 A1* | 8/2005 | Park | G09G 3/3611 345/1.1 |

(Continued)

FOREIGN PATENT DOCUMENTS

KR  10-2011-0123527 A  11/2011
KR  10-2012-0076365 A  7/2012

(Continued)

*Primary Examiner* — Grant Sitta
(74) *Attorney, Agent, or Firm* — Lewis Roca Rothgerber Christie LLP

(57) ABSTRACT

A display apparatus includes first and second display areas, first pixels in the first display area, and second pixels in the second display area. Gate lines are connected to the first pixels. First gate electrode lines are connected to the second pixels. First gate driving lines are respectively connected to the first gate electrode lines. A first gate driver outputs first scanning signals to the first pixels via the gate lines. A second gate driver outputs second scanning signals to the second pixels via the first gate driving lines and the first gate electrode lines.

23 Claims, 12 Drawing Sheets

(56) References Cited

U.S. PATENT DOCUMENTS

| | | | |
|---|---|---|---|
| 2006/0050011 A1* | 3/2006 | Kamio | G09G 3/3666 345/1.1 |
| 2007/0024524 A1* | 2/2007 | Lai | G06F 3/1431 345/1.1 |
| 2007/0120763 A1* | 5/2007 | De Paepe | G09G 5/006 345/1.3 |
| 2007/0177088 A1* | 8/2007 | Koyama | G09G 3/3233 349/139 |
| 2008/0043009 A1* | 2/2008 | Kim | G09G 3/3622 345/211 |
| 2008/0117497 A1* | 5/2008 | Shimodaira | G02F 1/1345 359/296 |
| 2008/0158124 A1* | 7/2008 | Kim | G09G 3/3648 345/92 |
| 2008/0259015 A1* | 10/2008 | Nose | G09G 3/36 345/89 |
| 2009/0273555 A1* | 11/2009 | Song | G09G 3/3666 345/96 |
| 2012/0194773 A1* | 8/2012 | Kim | G02F 1/13336 349/139 |
| 2012/0235713 A1* | 9/2012 | Mori | H05K 1/0289 327/109 |
| 2013/0187962 A1* | 7/2013 | Vieri | G09G 3/20 345/698 |
| 2013/0229400 A1* | 9/2013 | Kim | G06F 3/038 345/212 |
| 2014/0300837 A1 | 10/2014 | Gates et al. | |
| 2015/0014650 A1 | 1/2015 | Lim et al. | |
| 2015/0156867 A1* | 6/2015 | Kim | G02F 1/13452 361/767 |
| 2015/0206509 A1* | 7/2015 | Moh | G09G 5/18 345/213 |
| 2015/0243212 A1* | 8/2015 | Lee | G09G 3/3225 345/212 |
| 2015/0355487 A1* | 12/2015 | Emmert | G02F 1/13306 349/33 |
| 2016/0019852 A1* | 1/2016 | Kim | G09G 3/3666 345/103 |
| 2016/0111055 A1 | 4/2016 | Na et al. | |
| 2016/0189664 A1* | 6/2016 | Lee | H01L 27/124 345/208 |
| 2016/0232837 A1* | 8/2016 | Lee | G09G 3/3688 |
| 2016/0351098 A1* | 12/2016 | Lin | G09G 3/20 |
| 2017/0047544 A1 | 2/2017 | Kang et al. | |
| 2017/0053450 A1* | 2/2017 | Rodriguez | G06T 7/579 |
| 2017/0148399 A1* | 5/2017 | Melnik | G09G 3/3614 |
| 2017/0154598 A1* | 6/2017 | Park | G09G 3/3677 |
| 2018/0061338 A1* | 3/2018 | Lee | G09G 3/3648 |
| 2018/0174531 A1* | 6/2018 | Chen | G09G 3/3648 |

FOREIGN PATENT DOCUMENTS

| | | |
|---|---|---|
| KR | 10-2015-0047400 A | 5/2015 |
| KR | 10-2016-0045215 A | 4/2016 |
| KR | 10-2017-0019553 A | 2/2017 |

\* cited by examiner

DISPLAY APPARATUS

CROSS-REFERENCE TO RELATED APPLICATION

Korean Patent Application No. 10-2016-0078619, filed on Jun. 23, 2016, and entitled, "Display Apparatus," is incorporated by reference herein in its entirety.

BACKGROUND

1. Field

One or more embodiments relate to a display apparatus.

2. Description of the Related Art

Displays have been developed to have various 2-dimensional shapes. Examples include rectangular, circular, and hexagonal. Some displays are applied to analog clocks. In such a case, the display has a hole through which rotational axes of an hour hand, a minute hand, and a second hand are inserted. Other devices having displays include smart phones. In these devices, through holes may be included to accommodate sensors, speakers, front cameras, and other elements installed in a display area.

SUMMARY

In accordance with one or more embodiments, a display apparatus includes a substrate including a first display area and a second display area; a display including: a plurality of pixels including first pixels in the first display area and second pixels in the second display area; a plurality of gate lines extending in a first direction and connected to the first pixels; a plurality of first gate electrode lines extending in the first direction and connected to the second pixels; and a plurality of first gate driving lines extending in a second direction different from the first direction, the first gate driving lines respectively connected to the first gate electrode lines; a first gate driver to output first scanning signals to the first pixels via the gate lines; and a second gate driver to output second scanning signals to the second pixels via the first gate driving lines and the first gate electrode lines.

A first scanning period for the first gate driver to output the first scanning signals may be shorter than a second scanning period for the second gate driver to output the second scanning signals. Within a single frame period, the second gate driver may output the second scanning signals to the second pixels after the first gate driver outputs the first scanning signals to the first pixels.

The substrate may include an inner non-display area between the first display area and the second display area, and a through hole that penetrates through the substrate in the inner non-display area of the display. The display may include a plurality of data lines extending in the second direction and connected to the first pixels and the second pixels, and the data lines include first data lines including first portions separated from second portions by the through hole in the second direction and second data lines spaced from the through hole in the first direction and electrically and respectively connected to the second portions of the first data lines.

The apparatus may include a plurality of data connecting lines connecting the second portions of the first data lines to the second data lines, respectively. The second pixels may be connected to the second portions of the first data lines. The data lines may include third data lines spaced from the through hole in the first direction, and the second data lines may be between the first data lines and the third data lines in the first direction.

The substrate may include a display area and an edge non-display area surrounding the display area, and the display area may include the first display area; the second display area; and a third display area which is adjacent to the first display area in the second direction and adjacent to the second display area and the inner non-display area in the first direction, and the pixels include a plurality of third pixels in the third display area. The inner non-display area may be adjacent to the edge non-display area.

The display may include a plurality of second gate electrode lines extending in the first direction and connected to the third pixels; and a plurality of second gate driving lines extending in the second direction and respectively connected to the second gate electrode lines, the second gate driver is to output third scanning signals to the third pixels via the second gate driving lines and the second gate electrode lines.

Within a single frame period, a time period for the second gate driver to output the third scanning signals to the third pixels may be between a time period for the first gate driver to output the first scanning signals to the first pixels and a time period for the second gate driver to output the second scanning signals to the second pixels. The display area may include a fourth display area adjacent to the first display area in the first direction, the second display area and the inner non-display area may be between the third display area and the fourth display area in the first direction, and the pixels may include a plurality of fourth pixels on the fourth display area.

The display may include third gate electrode lines extending in the first direction and connected to the fourth pixels; and third gate electrode lines extending in the second direction and respectively connected to the third gate electrode lines, the second gate driver is to output fourth scanning signals to the fourth pixels via the third gate driving lines and the third gate electrode lines. A time period for the second gate driver to output the third scanning signals to the third pixels and a time period for the second gate driver to output the fourth scanning signals to the fourth pixels may overlap each other.

The gate lines may be directly connected to the first gate driver and the first gate driving lines may be directly connected to the second gate driver. The first gate driver may be at a side of the first display area in the first direction, and the second gate driver may be at a side of the second display area in the second direction. The through hole may be recessed from an edge of the substrate. Each of the pixels may include a pixel circuit including at least one thin-film transistor and a storage capacitor; and a light emitter connected to the pixel circuit. The light emitter may include an organic light-emitting device.

In accordance with one or more other embodiments, a display apparatus may include a first pixel; a second pixel; and a control line connected to the first pixel and the second pixel, wherein the control line is to transfer data signals to the first pixel and the second pixel based on respective first and second scan signals which have different periods, and wherein the first pixel is in a first row or column and the second pixel is in a second row or column. The first pixel may be in a display area and the second pixel may be adjacent to a hole in the display area. The hole may be in an interior portion of the display area. The period of the second scan signal may be longer than the period of the first scan signal. The control line may include two data lines connected by another line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
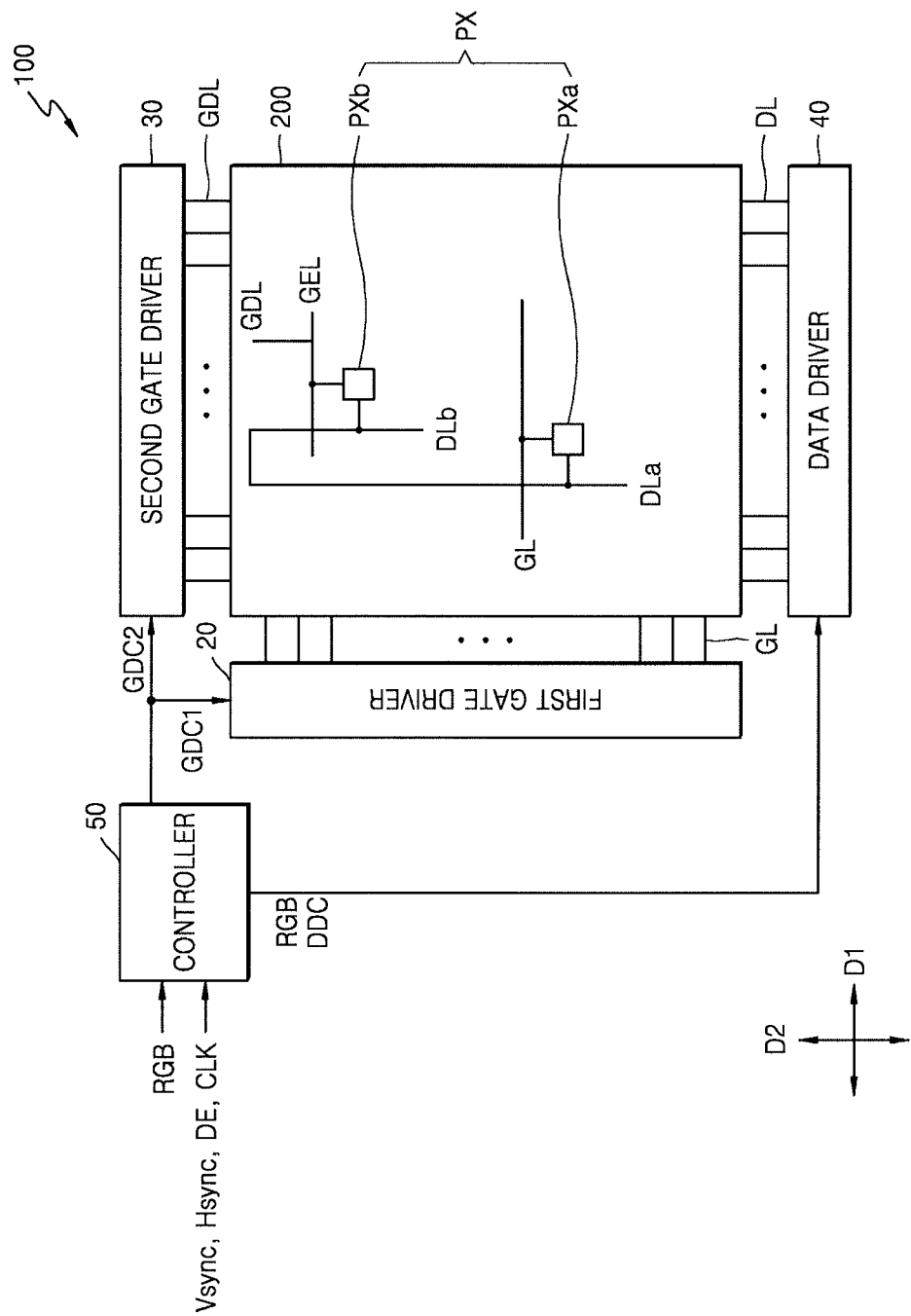
FIG. 1 illustrates an embodiment of a display apparatus.

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display apparatus 100 which includes a display unit 200, a first gate driver 20, a data driver 40, and a controller 50. The display apparatus 100 may be an organic light-emitting display apparatus including a plurality of pixels PX. Each pixel PX includes an organic light-emitting device like an organic light-emitting diode. he display apparatus 100 may be a liquid crystal display (LCD) apparatus including a liquid crystal layer. The display apparatus 100 may be another type of display or different types of light emitters may be used in other embodiments.

The display unit 200 includes the pixels PX, each of which includes a display device and a pixel circuit for driving the display device. The pixel circuit includes one or more thin-film transistors and at least one capacitor (e.g., storage capacitor). The display device may be an organic light-emitting device, e.g., an organic light-emitting diode.

Gate lines GL and gate electrode lines GEL extending in a first direction D1 and data lines DL and gate driving lines GDL extending in a second direction D1 are arranged on the display unit 200. The first direction D1 may be a row direction, and the second direction D2 may be a column direction. The gate driving lines GDL may be respectively connected to the gate electrode lines GEL on a one-on-one basis. Some of the gate electrode lines GEL may be separately arranged in the first direction D1.

The pixels PX include first pixels PXa arranged in a matrix form at some areas of the display unit 200 and second pixels PXb arranged in a matrix form at one or more other areas of the display unit 200. For convenience of explanation, FIG. 1 shows only one first pixel PXa and only one second pixel PXb. The first pixel PXa and the second pixel PXb in FIG. 1 may be at columns and rows different from each other. The first pixels PXa and the second pixels PXb may have the same pixel circuits and display devices. In another embodiment, the first pixels PXa and the second pixels PXb may have different types of pixel circuits.

Each of the first pixels PXa of a same column is connected to a first data line DLa, and each of the first pixels PXa of a same row are connected to a same the gate line GL. Each of the second pixels PXb is connected to a second data line DLb of a same column from and the gate electrode line GEL among the gate electrode lines GEL. The gate electrode line GEL is connected to a corresponding one of the gate driving lines GDL. The first data line DLa may be electrically connected to the second data line DLb, for example, via a data connecting line.

The first data line DLa is directly connected to the data driver 40 to transfer a data signal from the data driver 40 to the first pixels PXa and the second pixels PXb. The gate line GL is directly connected to the first gate driver 20 and transfers at least one control signal (e.g., a control signal including a first scanning signal) output by the first gate driver 20 to the first pixels PXa. The gate driving line GDL is directly connected to a second gate driver 30 and transfers at least one control signal (e.g., a control signal including a second scanning signal) output by the second gate driver 30 to the second pixels PXb.

Each of the gate line GL, the gate electrode line GEL, and the gate driving line GDL is shown as a single line. In another embodiment, each of the gate line GL, the gate electrode line GEL, and the gate driving line GDL may include a plurality of lines for transferring a plurality of control signals including scanning signals in parallel, for example, according to types of pixel circuits.

An internal non-display area that does not include pixels may be between an area including the first pixels PXa and an area including the second pixels PXb. A through hole that penetrates through the display unit 200 may be in the internal non-display area.

A first driving voltage ELVDD and a second driving voltage ELVSS (refer, e.g., to FIG. 4) may be supplied to the pixels PX. The first driving voltage ELVDD and the second driving voltage ELVSS drive a light-emitting device of a pixel circuit to emit light at a desired brightness. The first driving voltage ELVDD may have a higher level than the second driving voltage ELVSS. According to types of pixel circuits, voltages other than the first driving voltage ELVDD and the second driving voltage ELVSS (e.g., a reference voltage Vref, an initialization voltage Vinit, etc.) may be supplied to the pixels PX.

The pixel circuit may control the amount of current flowing from the first driving voltage ELVDD to the second driving voltage ELVSS, via a light-emitting device, based on a voltage level of a data signal transferred via the data line DL. The data signal may have a voltage level in a predetermined grayscale range and may be applied to the pixel circuit via the data line DL. The voltage level of the data signal may be referred to as a data voltage. A light-emitting device of the pixel PX emits light at a brightness based on the voltage level of a data signal. In one embodiment, PX may be a portion of a pixel (e.g., a sub-pixel) for emitting one of a plurality of colors.

The controller 50 receives timing signals (e.g., a vertical synchronization signal Vsync, a horizontal synchronization signal Hsync, a data enable signal DE, and a clock signal CLK, and image data RGB) from an external device. The controller 50 may control timings for operating the first and second data drivers 20 and 30 and the data driver 40 using the timing signals. The controller 50 may count data enable signals DE for a single horizontal scanning period and determine a single frame period. In this case, the controller 50 may not receive a vertical synchronization signal Vsync and a horizontal synchronization signal Hsync from an external device. Image data RGB includes information regarding luminance of the pixels PX. Luminance includes a set number of grayscale levels, e.g., 1024, 256, or 64.

The controller 50 may generate control signals including a first gate timing control signal GDC1 for controlling a timing for operating the first gate driver 20, a second gate timing control signal GDC2 for controlling a timing for operating the second gate driver 30, and a data timing control signal DDC for controlling a timing for operating the data driver 40.

The first gate timing control signal GDC1 may include a first gate start pulse GSP1, a gate shift clock GSC, and a gate output enable signal GOE. The first gate start pulse GSP1 is output to a gate driving circuit of the first gate driver 20 that outputs the first scanning signal. The gate shift clock GSC is a clock signal commonly input to gate driving circuits of the first gate driver 20. For example, the gate shift clock GSC may be a clock signal for shifting the first gate start pulse GSP1. The gate output enable signal GOE controls output of the first gate driver 20.

The second gate timing control signal GDC2 may include a second gate start pulse GSP2, a gate shift clock GSC, and a gate output enable signal GOE. The second gate start pulse GSP2 is output to a gate driving circuit of the second gate driver 30 that outputs the second scanning signal. The gate shift clock GSC is a clock signal commonly input to gate driving circuits of the second gate driver 30. For example, the gate shift clock GSC may be a clock signal for shifting the second gate start pulse GSP2. The gate output enable signal GOE controls output of the second gate driver 30.

In another example, the second gate timing control signal GDC2 may not include the gate shift clock GSC and the gate output enable signal GOE. The gate shift clock GSC and the gate output enable signal GOE of the first gate timing control signal GDC1 may be input to the second gate driver 30.

The first pixels PXa operate based on control signals output by the first gate driver 20. The second pixels PXb operate based on control signals output by the second gate driver 30. The operation cycle of the second pixels PXb may be different from the operation cycle of the first pixels PXa. For example, the first pixels PXa may receive a new data signal at every frame period and emit light at different brightnesses according to received data signals. The second pixels PXb may receive a new data signal at every set number of frame periods. For example, the second pixels PXb may receive a new data signal at every 2, 5, 10, 30, or 60 frame periods and emit light at different brightnesses. The controller 50 may output a first gate start pulse GSP1 to the first gate driver 20 at every frame period and may output a second gate start pulse GSP2 to the second gate driver 30 at every set number of frame periods.

The data timing control signal DDC may include a source start pulse SSP, a source sampling clock SSC, a source output enable signal SOE, etc. The source start pulse SSP controls a data sampling start time point of the data driver 40. The source sampling clock SSC is a clock signal that controls a data sampling operation in the data driver 40 based on a rising edge or a falling edge of the source sampling clock SSC. The source output enable signal SOE controls an output of the data driver 40. In one embodiment, the source start pulse SSP supplied to the data driver 40 may be omitted based on data transmission protocols.

Based on the first gate timing control signal GDC1, the first gate driver 20 generates control signals in a pre-set order for operating thin-film transistors of the first pixels PXa. The first gate driver 20 supplies the control signals to the first pixels PXa via the gate lines GL.

Based on the second gate timing control signal GDC2, the second gate driver 30 generates control signals in a pre-set order for operating thin-film transistors of the second pixels PXb. The second gate driver 30 supplies the control signals to the second pixels PXb via the gate driving lines GDL and the gate electrode lines GEL.

Based on the data timing control signal DDC, the data driver 40 samples and latches digital image data RGB, thereby transforming the same into parallel image data. The data driver 40 transforms the parallel image data to analog data signals having voltage levels. The data driver 40 supplies the data signals to the pixels PX via the data lines DL.

Figure 2:
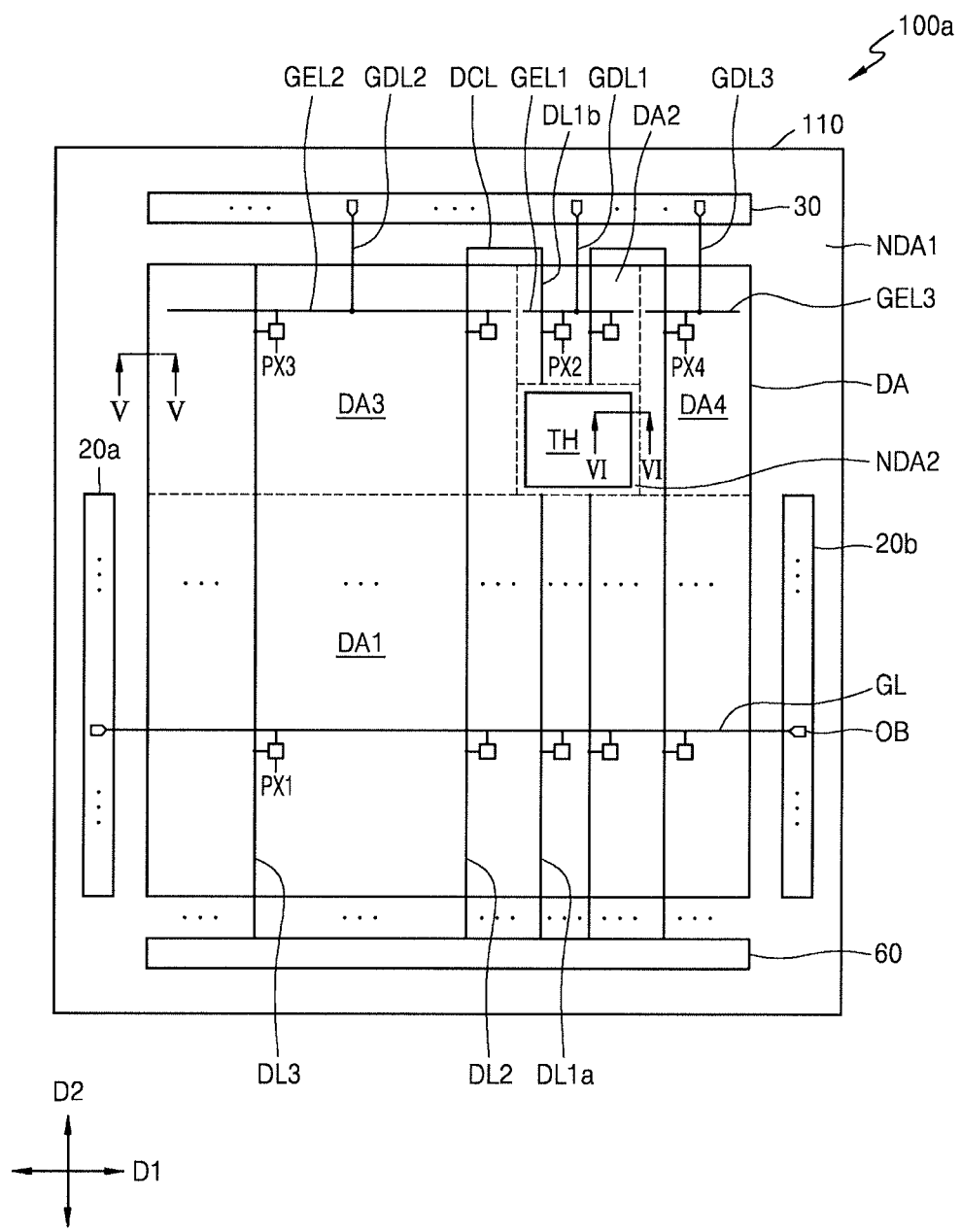
FIG. 2 illustrates another embodiment of a display apparatus.

FIG. 2 illustrates another embodiment of a display apparatus 100a which includes a substrate 110, the display unit 200 of FIG. 1 on the substrate 110, and a through hole TH that penetrates through the display unit 200. The substrate 110 includes a display area DA and a non-display area NDA. The display area DA includes pixels PX to display an image. The display unit 200 is on the display area DA. The non-display area NDA does not display an image and includes an edge non-display area NDA1 surrounding the display area DA and an inner non-display area NDA2 inside the display area DA. The through hole TH is in the inner non-display area NDA2.

A first gate driver 20a, the second gate driver 30, a third gate driver 20b, and a display driver 60 are on the edge non-display area NDA1. The first gate driver 20a and the third gate driver 20b function as the first gate driver 20 of FIG. 1. In another embodiment one of the gate drivers may be omitted. If the display area DA is large, resistances and parasitic capacitances of the gate lines GL increase. Thus, RC delay occurs. The first gate driver 20a and the third gate driver 20b may apply the same control signals to the gate lines GL from two directions, thereby reducing RC delay. The display driver 60 may be directly mounted on the substrate 110, for example, in a display driving chip or may be connected to the substrate 110 via a flexible printed circuit board. The display driver 60 functions as the data driver 40 of FIG. 1 and may also function as the controller 50 of FIG. 1.

The through hole TH penetrates at least one of the substrate 110 or the display unit 200 and may be in the inner non-display area NDA2. The outer edges of the through hole TH may be completely surrounded by the pixels PX. The through hole TH may be a hole that penetrates through layers of the substrate 110 and the display unit 200 in the thickness direction. A camera, sensor, speaker, microphone, and/or various other devices may be in or at the through hole TH. According to another embodiment, the through hole TH may provide a space for allowing a separate element to be installed for providing a function of the display apparatus 100 or an element for providing a new function of the display apparatus 100.

According to another embodiment, the through hole TH may have a structure in which layers including a transparent material for transmitting light therethrough are stacked. For example, no pixel PX for diffusing or blocking light, no signal line, and no power line may be in the through hole TH. In this case, a camera, optical sensor, or other optical device may be disposed over the through hole TH.

In FIG. 2, the through hole TH has a rectangular shape. In other embodiments, the through hole TH may have another shape, e.g., a polygonal shape (e.g., a triangular shape), a circular shape, an elliptical shape, or another shape. The number and locations of the through hole TH may vary among embodiments.

The display area DA may include first to fourth display areas DA1 to DA4. The first display area DA1 may be an area below the inner non-display area NDA2 in FIG. 2. The second display area DA2 may be an area above the inner non-display area NDA2 in FIG. 2. The third display area DA3 may be an area left to the inner non-display area NDA2 and the second display area DA2, and may be directly adjacent to the first display area DA1 in a second direction. The fourth display area DA4 may be an area right to the inner non-display area NDA2 and the second display area DA2, and may be directly adjacent to the first display area DA1 in the second direction. As shown in FIG. 2, the inner non-display area NDA2 may be between the first to fourth display areas DA1 to DA4.

According to embodiments, the inner non-display area NDA2 may be at one of various locations, where there may not be at least one of the second to fourth display areas DA2 to DA4 based on the location of the inner non-display area NDA2. For example, in FIG. 2, when the location of the inner non-display area NDA2 is moved to the right and the inner non-display area NDA2 is directly adjacent to the edge non-display area NDA1, there is no fourth display area DA4.

The pixels PX on the first display area DA1 include first pixels PX1. The pixels on the second display area DA2 include second pixels PX2. The pixels on the third display area DA3 include third pixels PX3. The pixels on the fourth display area DA4 include fourth pixels PX4.

The gate lines GL extending in the first direction D1 are in the first display area DA1. Each of the gate lines GL transfers a first scanning signal to the first pixels PX1 on a same row as the corresponding gate line GL. The gate lines GL are directly connected to the first gate driver 20a and the third gate driver 20b. The first gate driver 20a and the third gate driver 20b respectively include output buffers OB for outputting first scanning signals to the gate lines GL.

The first gate driver 20a and the third gate driver 20b may output control signals to the gate lines GL in a pre-set order. For example, the first gate driver 20a and the third gate driver 20b may sequentially output first scanning signals from the lower gate lines GL to the upper gate lines GL in FIG. 2. (A scanning signal may correspond to a pulse signal having a gate-on level for determining a timing to input a data signal).

Signals output by the first gate driver 20a and the third gate driver 20b have gate-off levels and gate-on levels. When signals output by the first gate driver 20a and the third gate driver 20b have gate-on levels, the scanning signals may be considered to be output. Therefore, a scanning signal applied to the pixel PX may correspond to as a data signal applied to the pixel PX.

First to third gate electrode lines GEL1 to GEL3 extending in the first direction D1 are in the second to fourth display areas DA2 to DA4, respectively. The first to third gate electrode lines GEL1 through GEL3 are arranged apart from one another in the first direction D1 and the second direction D2. The first gate electrode lines GEL1 are connected to the second pixels PX2 on a same row from among the second pixels PX2, respectively. The second gate electrode lines GEL2 are connected to the third pixels PX3 on a same row from among the third pixels PX3, respectively. The third gate electrode lines GEL3 are connected to the fourth pixels PX4 on a same row from among the fourth pixels PX4, respectively.

First to third gate driving lines GDL1 to GDL3 that connect the first to third gate electrode lines GEL1 to GEL3 to the output buffers OB of the second gate driver 30 are on the substrate 110. The first gate driving lines GDL1 are respectively connected to the first gate electrode lines GEL1. The second gate driving lines GDL2 are respectively connected to the second gate electrode lines GEL2. The third gate driving lines GDL3 are respectively connected to the third gate electrode lines GEL3.

The second gate driver 30 may output control signals including second to fourth scanning signals to the first to third gate driving lines GDL1 to GDL3 in a pre-set order. The second gate driver 30 may output second scanning signals to the second pixels PX2 in a pre-set order via the first gate driving lines GDL1 and the first gate electrode lines GEL1 connected to the first gate driving lines GDL1. The second gate driver 30 may output third scanning signals to the third pixels PX3 in a pre-set order, via the second gate driving lines GDL2 and the second gate electrode lines GEL2 connected to the second gate driving lines GDL2. The second gate driver 30 may output fourth scanning signals to the fourth pixels PX4 in a pre-set order via the third gate driving lines GDL3 and the third gate electrode lines GEL3 connected to the third gate driving lines GDL3.

The second gate driver 30 may output third and fourth scanning signals to the third pixels PX3 and the fourth pixels PX4 at a same row, from among the third pixels PX3 and the fourth pixels PX4, at a same timing. The second gate driver 30 may output second scanning signals to the second pixels PX2 after the second gate driver 30 outputs third and fourth scanning signals to the third pixels PX3 and the fourth pixels PX4.

Within a single frame period, the second gate driver 30 may output second to fourth scanning signals to the second through fourth pixels PX2 through PX4 after the first gate driver 20a and the third gate driver 20b output first scanning signals to the first pixels PX1.

The data lines DL extending from the display driver 60 in the second direction D2 are in the first display area DA1. The data lines DL may include first to third data lines DL1, DL2, and DL3. Each of the first data lines DL1 may include a first portion DL1a and a second portion DL1b that are separated from each other by the inner non-display area NDA2 in the second data signal D2. The inner non-display area NDA2 is between the first portion DL1a and the second portion DL1b of the first data lines DL1. The second portion DL1b may be on a line extending from the first portion DL1a. The first portions DL1a of the first data lines DL1 are directly connected to the display driver 60 and are on the first display area DA1. The second portions DL1b of the first data lines DL1 are on the second display area DA2 and are connected to the second pixels PX2 at a same row from among the second pixels PX2.

The second data lines DL2 are disposed apart from the inner non-display area NDA2 in the first direction D1 and are electrically connected to the second portions DL1b of the first data lines DL1. The second data lines DL2 may be connected to the second portions DL1b of the first data lines DL1 via data connecting lines DCL. The number of the first data lines DL1 may, for example, be identical to the number of the second data lines DL2 and the number of the data connecting lines DCL.

The third data lines DL3 are disposed apart from the inner non-display area NDA2 in the first direction D1 and extend from the display driver 60 in the second direction D2. The third data lines DL3 are not connected to the first data lines DL1 or the second data lines DL2. The second data lines DL2 may be closer to the first data lines DL1 than to the third data lines DL3. The second data lines DL2 and the third data lines DL3 are connected to some of the first pixels PX1 and the third and fourth pixels PX3 and PX4.

Figure 3:
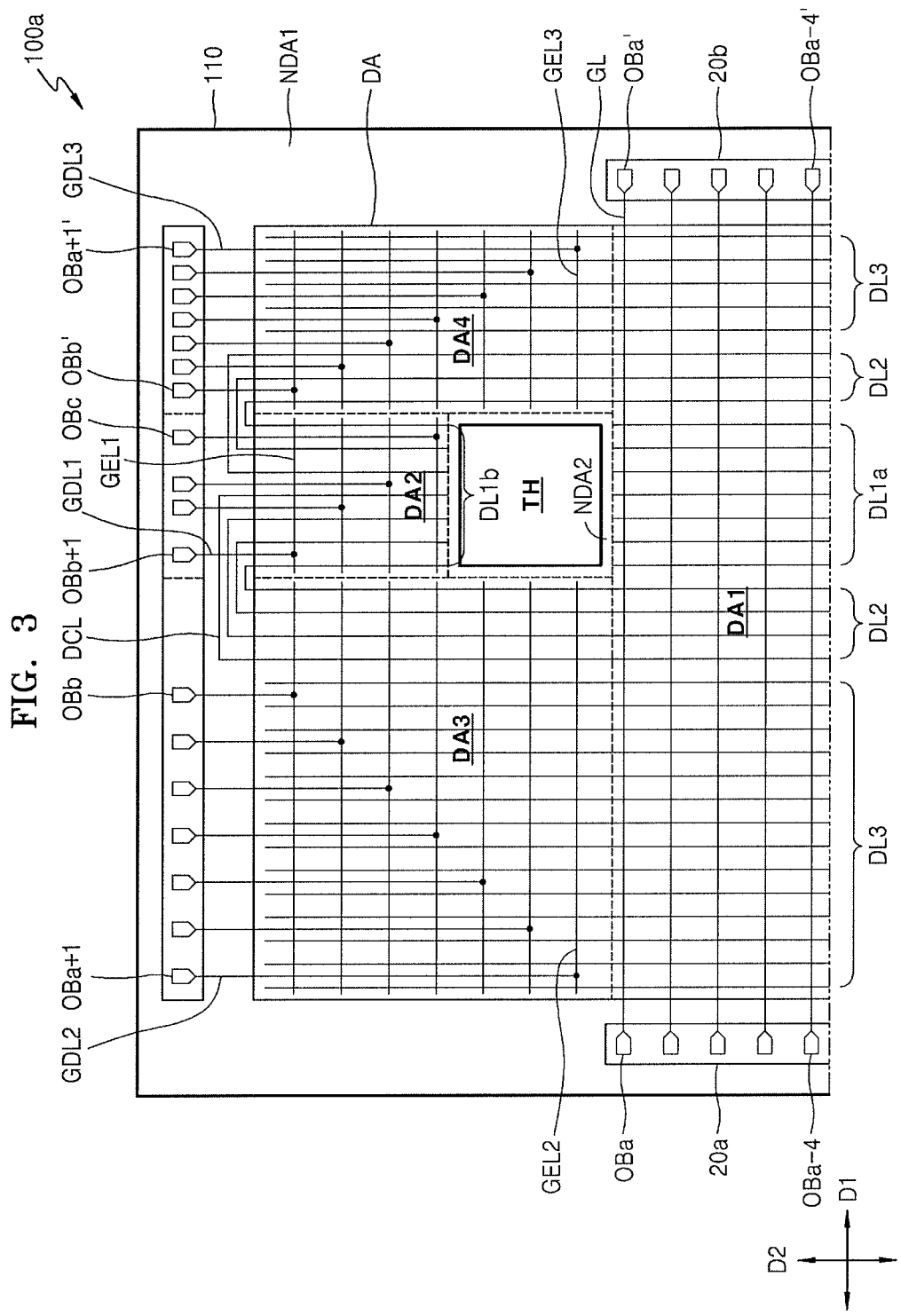
FIG. 3 illustrates an embodiment of a portion of the display apparatus of FIG. 2.

FIG. 3 illustrates an embodiment of a portion of the display apparatus 100a in FIG. 2. The first gate driver 20a includes output buffers OBa−4 through OBa connected to the gate lines GL. In correspondence to the first gate driver 20a, the third gate driver 20b includes output buffers OBa−4' through OBa' connected to the gate lines GL.

The output buffer OBa−4 and the output buffer OBa−4' output first scanning signals to a corresponding gate line GL at a same timing. The output buffer OBa and the output buffer OBa' output first scanning signals to a corresponding gate line GL at a same timing. Accordingly, first scanning signals are sequentially applied to the gate lines GL from the lowermost gate line GL to the uppermost gate line GL.

The second gate driver 30 includes output buffers OBa+1 through OBb, OBb+1 through OBc, and OBa+1' through OBb'. The output buffers OBb+1 through OBc output second scanning signals to the first gate electrode lines GEL1 via the first gate driving lines GDL1. The output buffers OBa+1 through OBb output third scanning signals to the second gate electrode lines GEL2 via the second gate driving lines GDL2. The output buffers OBa+1' through OBb' output fourth scanning signals to the third gate electrode lines GEL3 via the third gate driving lines GDL3.

The timing at which the output buffers OBa+1 output third scanning signals may be identical to the timing at which the output buffers OBa+1' output fourth scanning signals. The timing at which the output buffers OBb output third scanning signals may be identical to the timing at which the output buffers OBb' output fourth scanning signals. Therefore, the third pixels PX3 and the fourth pixels PX4 at the same row, from among the third pixels PX3 in the third display area DA3, and the fourth pixels PX4 in the fourth display area DA4 receive third and fourth scanning signals at the same timing.

After the output buffers OBa+1 through OBb and the output buffers OBa+1' through OBb' output third and fourth scanning signals, the output buffers OBb+1 through OBc may output second scanning signals. In one embodiment, the output buffer OBb+1 may output a second scanning signal first and the output buffer OBc may output a second scanning signal at the end.

The data lines DL extend in the second direction D2 and include the first to third data lines DL1, DL2, and DL3. The first data lines DL1 are data lines DL divided by the inner non-display area NDA2 and include the first portions DL1a and the second portions DL1b. The second portions DL1b are on the second display area DA2. The second data lines DL2 are connected to the first portions DL1a of the first data lines DL1 via the data connecting lines DCL, respectively.

The data connecting lines DCL may be on the edge non-display area NDA1. To prevent the data connecting lines DCL from crossing one another, second portions DL1b of the first data lines DL1 and the second data lines DL2 are connected to one another, for example, in the order of their arrangement. In one embodiment, the data connecting lines DCL may cross one another.

Figure 4:
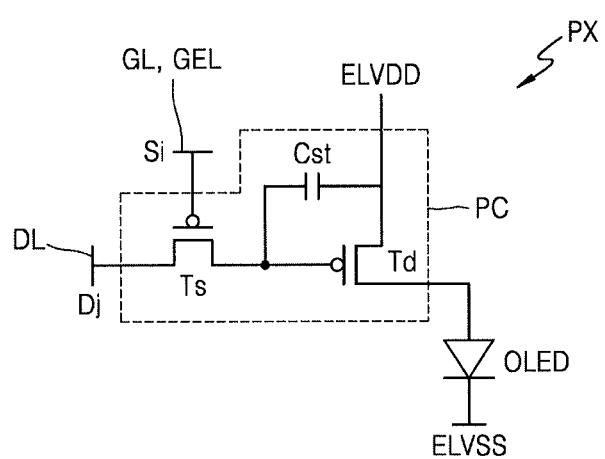
FIG. 4 illustrates an embodiment of a pixel.

FIG. 4 illustrates an embodiment of a pixel PX of a display apparatus, which, for example, may be any of the embodiments of the display apparatus described herein. Referring to FIG. 4, the pixel PX includes a pixel circuit PC. The pixel circuit PC includes a switching thin-film transistor Ts, a driving thin-film transistor Td, and a storage capacitor Cst, and a display device. The display device may include an organic light-emitting device OLED or an organic light-emitting diode.

The switching thin-film transistor Ts includes a gate connected to the gate line GL or the gate electrode line GEL. The switching thin-film transistor Ts is connected to the data line DL and transfers a data voltage Dj input via the data line DL to the driving thin-film transistor Td based on a scanning signal Si applied to the gate.

The storage capacitor Cst is connected between the switching thin-film transistor Ts and a driving voltage line PL, and stores a voltage having a level based on the difference between the level of the data voltage Dj transferred from the switching thin-film transistor Ts and the level of a first driving voltage ELVDD applied to the driving voltage line PL.

The driving thin-film transistor Td is connected to the driving voltage line PL and the storage capacitor Cst. The driving thin-film transistor Td generates driving current, that flows from the driving voltage line PL through the organic light-emitting device OLED, based on the voltage level stored in the storage capacitor Cst. The organic light-emitting device OLED may emit light of a desired brightness based on the driving current.

In other embodiments, the pixel PX may have a different configuration or structure than the pixel in FIG. 4, and, for example, may have a different number of transistors and/or capacitors. For example, in order to perform various other functions including compensation of the threshold voltage of the driving thin-film transistor Td and initialization of the driving thin-film transistor Td and the organic light-emitting device OLED, the pixel circuit PC may include not only the driving thin-film transistor Td and the switching thin-film transistor Ts, but also additional thin-film transistors that operate based on other control signals, e.g., ones other than a compensating signal or an initializing signal. The driving thin-film transistor Td and switching thin-film transistor Ts in FIG. 4 are p-type transistors. In an other embodiment, all or a portion of the thin-film transistors in the pixel circuit PC may be an n-type transistor.

Figure 5:
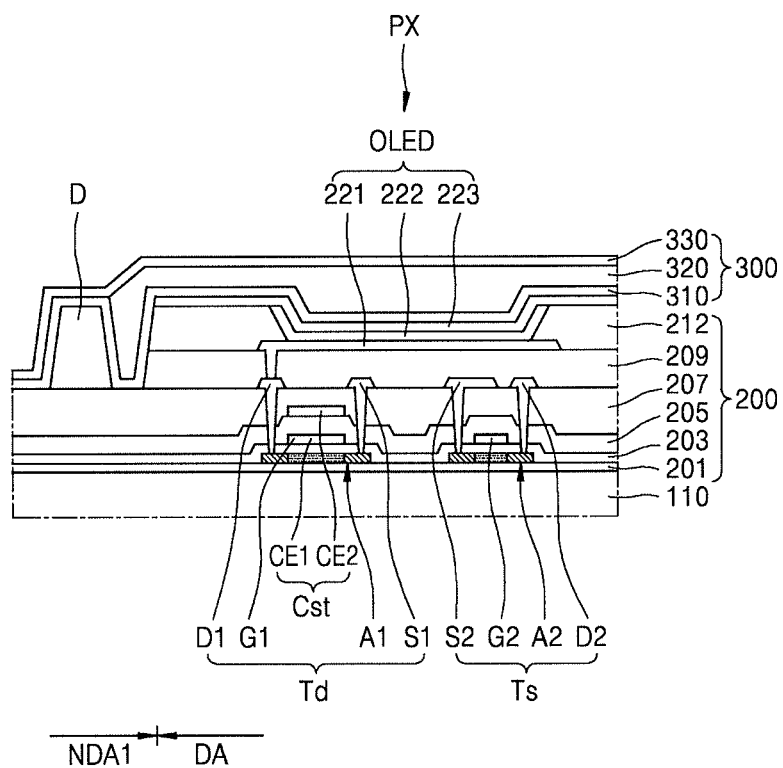
FIG. 5 illustrates a cross-sectional taken along line V-V in FIG. 2.
Figure 6:
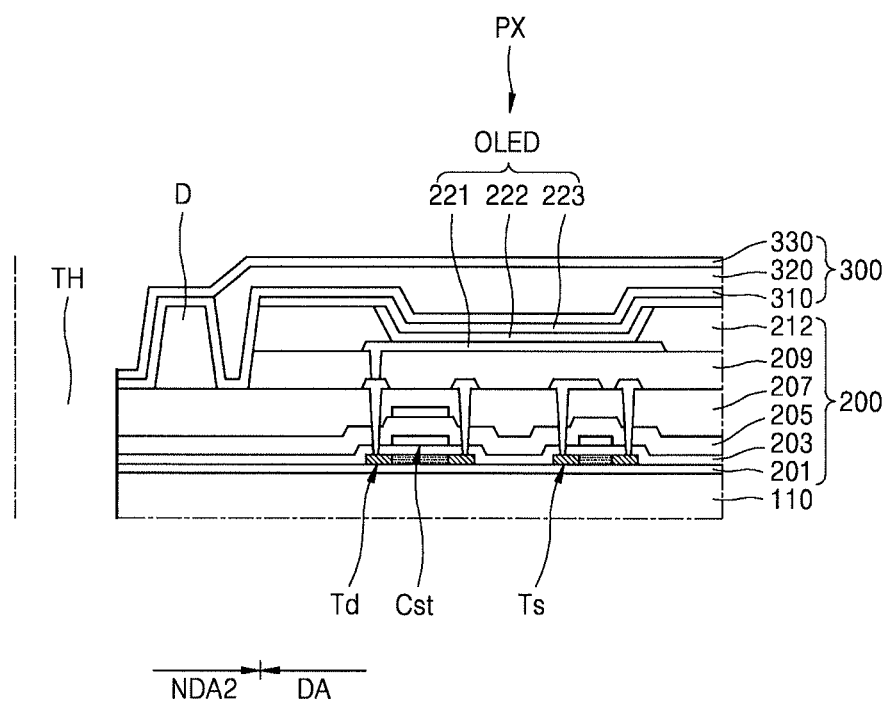
FIG. 6 illustrates a cross-sectional taken along line VI-VI in FIG. 2.

FIG. 5 is a cross-sectional view taken along a line V-V of FIG. 2, and FIG. 6 is a cross-sectional view taken along a line VI-VI of FIG. 2. First, the stack structures of the edge non-display area NDA1 and the display area DA will be described with reference to FIG. 5. Then, the stack structures of the inner non-display area NDA2 and the display area DA will be described with reference to FIG. 6.

Referring to FIG. 5, the display unit 200 is on the substrate 110, and the display unit 200 is sealed by an encapsulating film 300. The substrate 110 may include a material including glass, a metal, or an organic material. According to an embodiment, the substrate 110 may include a flexible material. For example, the substrate 110 may include a flexible material like polyimide (PI) or another material.

The display unit 200 includes a pixel circuit layer including the driving thin-film transistor Td, the switching thin-film transistor Ts, the storage capacitor Cst, and signal lines, a device layer including the organic light-emitting device OLED, and a plurality of insulation layers between the pixel circuit layer and the device layer. Layers of the display unit 200 will be described below in the order that the layers are stacked.

A buffer layer 201 may reduce or block introduction of foreign substances, moisture, or outside air from below the substrate 110 and provide a flat surface on the substrate 110. The buffer layer 201 may include an inorganic material (e.g., an oxide or a nitride), an organic material, or an organic/inorganic composite material and may include a single layer or a plurality of layers including the same.

The driving thin-film transistor Td includes a semiconductor layer A1, a gate electrode G1, a source electrode S1, and a drain electrode D1. The switching thin-film transistor Ts includes a semiconductor layer A2, a gate electrode G2, a source electrode S2, and a drain electrode D2. In FIG. 5, the switching thin-film transistor Ts and the driving thin-film transistor Td are top gate-type thin-film transistors, where the gate electrodes G1 and G2 are above the semiconductor layers A1 and A2. In another embodiment, the switching thin-film transistor Ts and the driving thin-film transistor Td may be bottom gate-type thin-film transistors.

According to an embodiment, semiconductor layers A1 and A2 may include amorphous silicon or polycrystalline silicon. According to another embodiment, the semiconductor layers A1 and A2 may include an oxide of at least one selected from a group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the semiconductor layers A1 and A2 may include a channel region and a source region and a drain region that are doped with an impurity.

A gate insulation layer 203 may be over the semiconductor layers A1 and A2 to cover the semiconductor layers A1 and A2. The gate insulation layer 203 may include an inorganic material including an oxide or a nitride. For example, the gate insulation layer 203 may include a silicon oxide ($SiO_x$), a silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrodes G1 and G2 may include a metal with low resistance. For example, the gate electrodes G1 and G2 may include molybdenum (Mo), aluminum (Al), copper (Cu), and titanium (Ti) and may include a single layer or a plurality of layers. According to an embodiment, the gate electrode G1 of the driving thin-film transistor Td may be a first electrode CE1 of the storage capacitor Cst.

A first interlayer insulation layer 205 may be over the first electrode CE1 to cover the first electrode CE1. For example, the first interlayer insulation layer 205 may include a silicon oxide ($SiO_x$), a silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second electrode CE2 is on the first interlayer insulation layer 205 to overlap the first electrode CE1 on the first interlayer insulation layer 205. The second electrode CE2 may include a conductive material including molybdenum (Mo), aluminum (Al), copper (Cu), and titanium (Ti) and may include a single layer or a plurality of layers including the above-stated material.

A second interlayer insulation layer 207 is over the second electrode CE2 to cover the second electrode CE2. For example, the second interlayer insulation layer 207 may include a silicon oxide ($SiO_x$), a silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The source electrodes S1 and S2 and the drain electrodes D1 and D2 may respectively contact the source regions and the drain regions of the semiconductor layers A1 and A2 via contact plugs that penetrate through the insulation layers 203, 205, and 207. The source electrodes S1 and S2 and the drain electrodes D1 and D2 may include a material with a predetermined (e.g., excellent) conductivity. For example, the source electrodes S1 and S2 and the drain electrodes D1 and D2 may include a conductive material containing molybdenum (Mo), aluminum (Al), copper (Cu), and titanium (Ti), and may include a single layer or a plurality of layers including the above-stated materials. According to an embodiment, the source electrodes S1 and S2 and the drain electrodes D1 and D2 may have Ti/Al/Ti multilayer structures.

A planarizing layer 209 covers the source electrodes S1 and S2 and the drain electrodes D1 and D2. The planarizing layer 209 may include a single layer or a plurality of layers including an organic material. For example, the planarizing layer 209 may include a general commercial polymer (PMMA or PS), a polymer derivative containing the phenol-based group, an acryl-based polymer, an imide-based polymer, an arylether-based polymer, an amide-based polymer, a fluorine-based polymer, a p-xylene-based polymer, a vinyl alcohol-based polymer, or a blend thereof. Furthermore, the planarizing layer 209 may include a composite stacked structure including an inorganic layer and an organic layer.

A pixel electrode 221 may be connected to the driving thin-film transistor Td through a via plug that penetrates through the planarizing layer 209. The pixel electrode 221 is exposed by an opening of a pixel defining layer 212. Edge portions of the pixel electrode 221 may be covered by the pixel defining layer 212. According to an embodiment, the pixel electrode 221 is a reflective electrode and may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

An intermediate layer 222 includes an emission layer and is located on a portion of the pixel electrode 221 exposed by the pixel defining layer 212. The emission layer may include an organic monomer or an organic polymer. Other than the emission layer, the intermediate layer 222 may include one or more additional functional layers, e.g., a hole transport layer (HTL), a hole injection layer (HIL), an electron transport layer (ETL), and an electron injection layer (EIL).

A counter electrode 223 may be a transparent or semi-transparent electrode. For example, the counter electrode 223 may include a metal thin-film containing a metal with a small work function, such as Li, Ca, LiF/Ca, LiF/Al, Al, Ag, Mg, or a compound thereof. The counter electrode 223 may include a transparent conductive oxide (TCO) layer including indium tin oxide (ITO), indium zinc oxide (IZO), zinc oxide (ZnO), indium oxide ($In_2O_3$), indium gallium oxide (IGO), or aluminum zinc oxide (AZO). The counter electrode 223 may have a multilayer structure in which the TCO layer is stacked on the metal thin-film. According to an unlimited embodiment, the counter electrode 223 may include a metal thin-film layer including silver (Ag) and magnesium (Mg).

The encapsulating film 300 covers the display unit 200 to prevent introduction of outside moisture and oxygen to the display unit 200. The encapsulating film 300 may be, for example, a multilayer including inorganic layers 310 and 330 and an organic layer 320.

The organic layer 320 and the inorganic layers 310 and 330 of the encapsulating film 300 may be alternately stacked. In FIG. 3, an example is illustrated in which the encapsulating film 300 includes the two inorganic layers 310 and 330 and the one organic layer 320. In one embodiment, the encapsulating film 300 may include a plurality of additional inorganic layers and organic layers that are alternately stacked, where the number of stacked layers may vary in different embodiments.

The inorganic layers 310 and 330 may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, or a silicon oxynitride. The inorganic layers 310 and 330 may be formed, for example, by a chemical vapor deposition (CVD) process.

The organic layer 320 may include one or more materials selected from a group consisting of an acryl-based resin, polyisoprene, a vinyl-based resin, an epoxy-based resin, an urethane-based resin, a cellulose-based resin, and a perylene-based resin. According to an embodiment, the organic layer 320 may be disposed by depositing a liquid monomer and curing the liquid monomer using heat or light, such as an ultraviolet (UV) ray. In order to prevent the liquid monomer from flowing toward end portions of the substrate 110 and forming edge tails of the organic layer 320, a dam D may be in the edge non-display area NDA1. The dam D may include a same material as the planarizing layer 209 and/or the pixel defining layer 212.

The inorganic layers 310 and 330 may be larger than the organic layer 320. Therefore, the inorganic layers 310 and 330 may contact each other, thereby preventing introduction of outside oxygen or moisture more efficiently.

Referring to FIG. 6, the structure in which the display unit 200 is located on the display area DA of the substrate 110 and is covered by the encapsulating film 300 may be identical to the stacked structure described above with reference to FIG. 5.

The through hole TH is in the inner non-display area NDA2 of the substrate 110. The through hole TH may not only penetrate through the substrate 110 and the display unit 200, but also may penetrate through the encapsulating film 300. The dam D may be between the through hole TH and the pixel PX of the display unit 200. As described above, the dam D is a structure for preventing formation of edge tails of the organic layer 320. The inorganic layers 310 and 330 may extend more toward the through hole TH than the organic layer 320 and contact each other at a region close to through hole TH.

Figure 7:
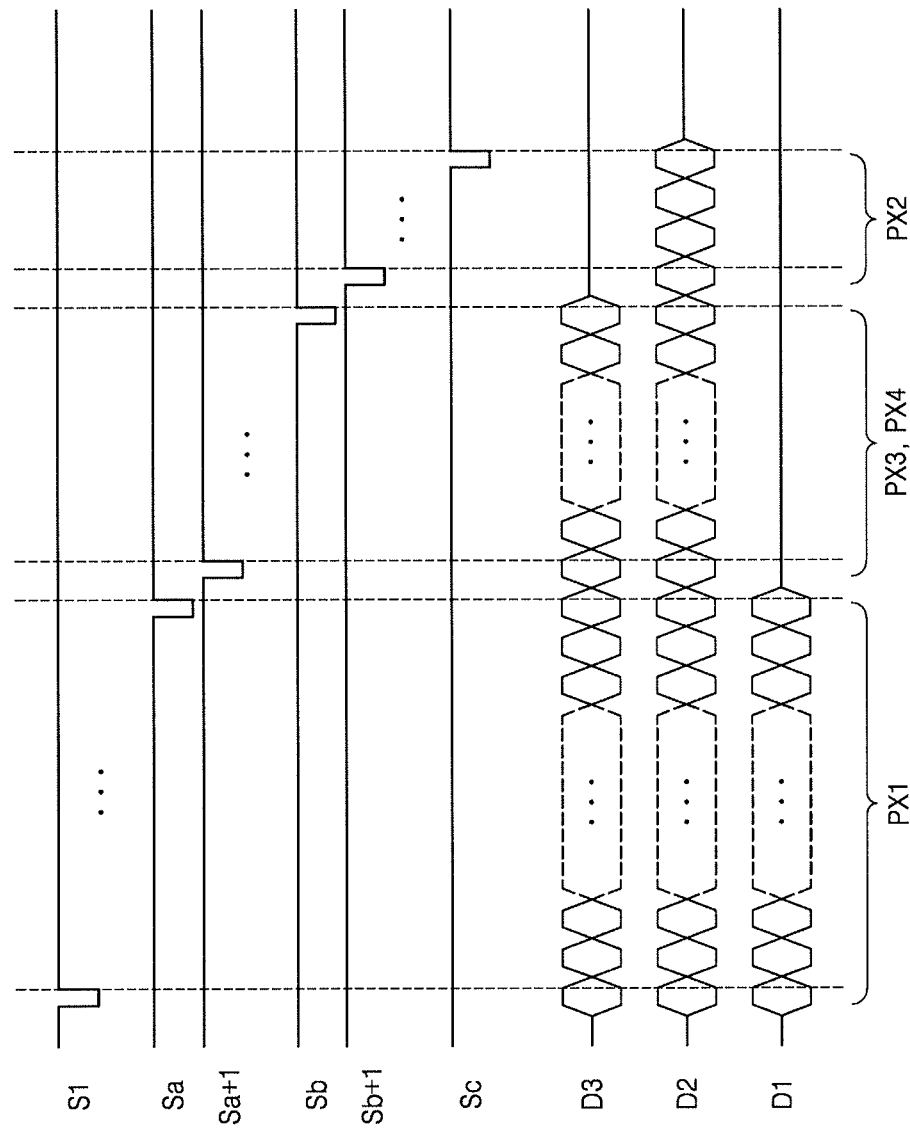
FIG. 7 illustrates an example of a timing diagram for driving a display apparatus.

FIG. 7 is an example of a timing diagram for driving a display apparatus. Referring to FIGS. 2, 3, and 7, first scanning signals S1 through Sa output by the first gate driver 20a and the third gate driver 20b and third scanning signals Sa+1 through Sb and second scanning signals Sb+1 through Sc output by the second gate driver 30 are illustrated. The first data signal D1 output by the display driver 60 to the first portions DL1a of the first data lines DL1, the second data signal D2 output by the display driver 60 to the second data lines DL2, and the third data signal D3 output by the display driver 60 to the third data lines DL3 are shown.

Fourth scanning signals output by the output buffers OBa+1' through OBb' may be identical to third scanning signals output by the output buffers OBa+1 through OBb of the second gate driver 30. Descriptions of the fourth scanning signals and the fourth pixels PX4 that respond to the fourth scanning signals may be as those of third scanning signals Sa+1 through Sb and the third pixels PX3.

A first scanning signal S1 is a first scanning signal in a single frame period and may be a signal applied to the first pixels PX1 via the bottommost gate line GL in FIG. 2. From among the first pixels PX1 connected to the bottommost gate line GL, the first pixel PX1 connected to the first portion DL1a of the first data lines DL1 receives the first data signal D1 synchronized with the first scanning signal S1. The first pixel PX1 connected to the second data line DL2 receives the second data signal D2 synchronized with the first scanning signal S1. The first pixel PX1 connected to the third data line DL3 receives the third data signal D3 synchronized with the first scanning signal S1.

A first scanning signal Sa is a signal simultaneously output by the output buffer OBa of the first gate driver 20a and the output buffer OBa' of the third gate driver 20b to the gate line GL. The gate line GL to which the first scanning signal Sa is output is the topmost gate line GL in the first display area DA1 in FIG. 3. All of the first pixels PX1 in the first display area DA1 receive the first to third data signals D1 to D3 based on the first scanning signals S1 to Sa.

After the first scanning signal Sa is output, a third scanning signal Sa+1 is output. The third scanning signal Sa+1 is output by the output buffer OBa+1 of the second gate driver 30 to the second gate electrode line GEL2 via the second gate driving line GDL2. The second gate electrode line GEL2 to which the third scanning signal Sa+1 is output is the bottommost second gate electrode line GEL2 in the third display area DA3 in FIG. 3 and is directly above the gate line GL to which the first scanning signal Sa is output. When the third scanning signal Sa+1 is output, no data signal D1 is transferred via the first data lines DL1.

A third scanning signal Sb is a signal output by the output buffer OBb of the second gate driver 30 to the second gate electrode line GEL2 via the second gate driving line GDL2. The second gate electrode line GEL2 to which the third scanning signal Sb is output is the topmost second gate electrode line GEL2 in the third display area DA3 in FIG. 3. All of the third pixels PX3 in the third display area DA3 receive second and third data signals D2 and D3 based on the third scanning signals Sa+1 through Sb. All of the fourth pixels PX4 in the fourth display area DA4 also receive the second and third data signals D2 and D3 when the third scanning signals Sa+1 through Sb are output.

After the third scanning signal Sb is output, a second scanning signal Sb+1 is output. The second scanning signal Sb+1 is a signal output by the output buffer OBb+1 of the second gate driver 30 to the first gate electrode line GEL1 via the first gate driving line GDL1. The first gate electrode lines GEL1 to which the second scanning signal Sb+1 is output may be the topmost first gate electrode line GEL1 in the second display area DA2 in FIG. 3. In one embodiment of a controller (50 of FIG. 1), the first gate electrode line GEL1 to which the second scanning signal Sb+1 is output may be the bottommost first gate electrode line GEL1 in the second display area DA2. When the second scanning signal Sb+1 is output, no data signal D3 is transferred via the third data lines DL3.

A second scanning signal Sc is output to the first gate electrode line GEL1 via the first gate driving line GDL1 from the output buffer OBc of the second gate driver 30. The first gate electrode line GEL1 to which the second scanning signal Sc is output may be the bottommost first gate electrode line GEL1 in the second display area DA2 in FIG. 3. All of the second pixels PX2 in the second display area DA2 receive the second data signals D2 based on the second scanning signals Sb+1 through Sc.

According to the process as described above, all of the pixels PX in the display area DA may receive data signals based on corresponding scanning signals. The pixel PX that received a data signal may emit light at a brightness determined according to the voltage level of the data signal. Therefore, the pixels PX may display an image in the display area DA.

Figure 8:
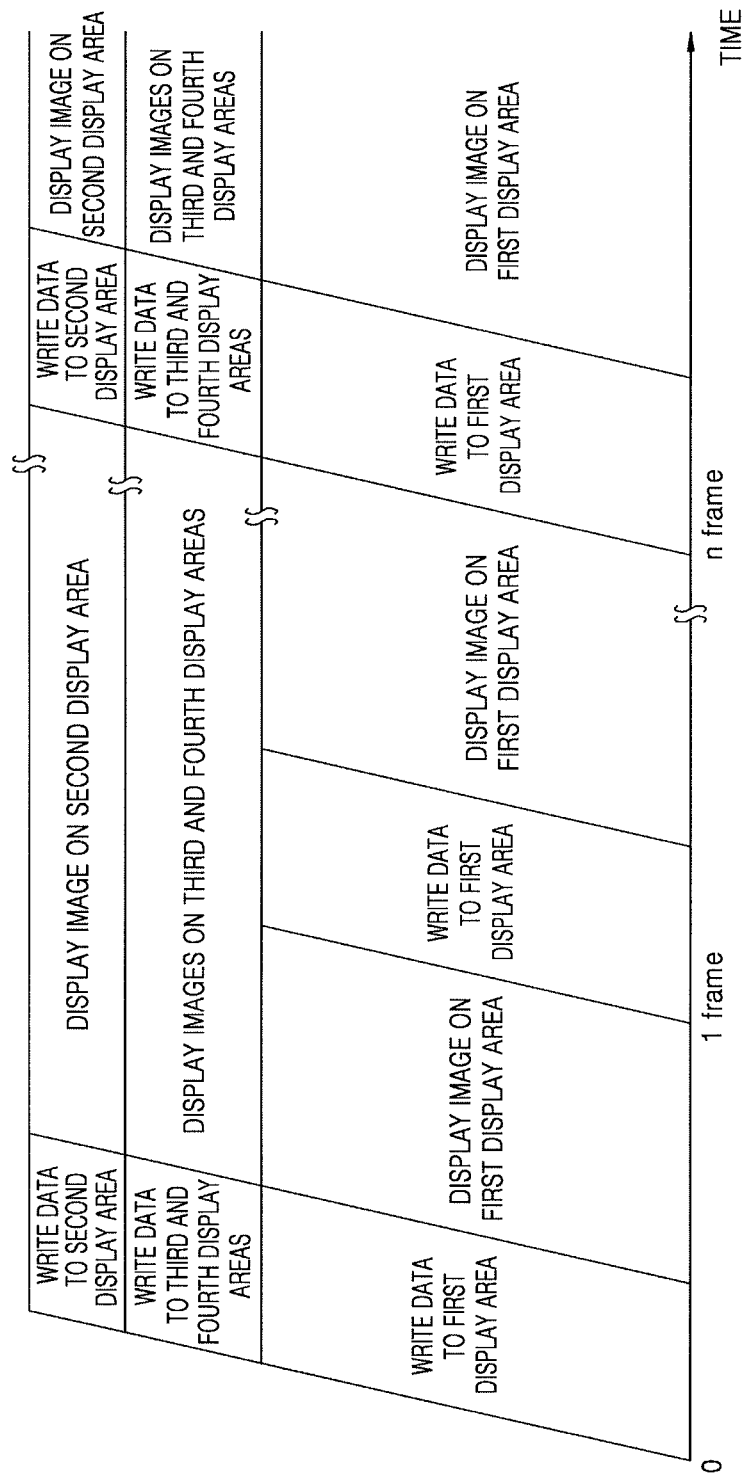
FIG. 8 illustrates operations of an embodiment of pixels of a display apparatus.

FIG. 8 illustrates operations of pixels of a display apparatus according to an embodiment. Referring to FIGS. 7 and 8, when a first frame is initiated, data signals are input to the first pixels PX1 in the first display area DA1. The first pixels PX1 to which the data signals are input display an image by emitting light at brightness according to the voltage levels of the data signals.

After the data signals are input to the first pixels PX1, data signals are input to the third pixels PX3 and the fourth pixels PX4 in the third display area DA3 and the fourth display area DA4. The third pixels PX3 and the fourth pixels PX4 display an image based on the input data signals.

Next, data signals are input to the second pixels PX2 in the second display area DA2. The second pixels PX2 also display an image based on the input data signals.

The display apparatus 100 may be, for example, a smart phone. State information including a telecommunication service provider information, currently executed application information, newly received notifications, and current time is displayed at the upper portion of the display screen of the smart phone. Unlike moving pictures, images displayed in relation to such state information are not rapidly changed. The first display area DA1 may be an area for displaying rapidly changing images like moving pictures, whereas the second through fourth display areas DA2 through DA4 may be areas for displaying state information.

When a second frame is initiated, new data signals are input to the first pixels PX1 in the first display area DA1. The first pixels PX1 to which the new data signals are input display a new image according to the new data signals. However, no new data signal is input to the second through fourth pixels PX2 through PX4 in the second through fourth display areas DA2 through DA4. The second through fourth display areas DA2 through DA4 may display previous images. The second gate driver 30 may be deactivated. For example, a scanning period for the second gate driver 30 to output second to fourth scanning signals may be longer than a single frame period, which is a scanning period for the first gate driver 20a and the third gate driver 20b to output first scanning signals. A scanning period for the second gate driver 30 to output second scanning signals may be identical to an integer multiple of the single frame period or different from the single frame period. In one embodiment, the second gate driver 30 may also output second through fourth scanning signals in every frame period. For example, a scanning period for the second gate driver 30 to output second scanning signals may also be identical to the single frame period.

As described above, since the second through fourth display areas DA2 to DA4 do not display rapidly-changing images and display state information, power consumption may be reduced by displaying new images therein at frame speeds slower than a frame speed of the first display area DA1. According to the present embodiment, since the second gate driver 30 is separately provided, frame speeds of some areas may be lowered, thereby reducing power consumption.

Like when the first frame is initiated, when a pre-set $n^{th}$ frame is initiated, new data signals may be input to the first pixels PX1 in the first display area DA1, new data signals may be input to the third pixels PX3 and the fourth pixels PX4 in the third display area DA3 and the fourth display area DA4, and new data signals may be input to the second pixels PX2 in the second display area DA2 in the order stated. Therefore, the first to fourth display areas DA1 to DA4 display new images based on the newly input data signals.

Figure 9:
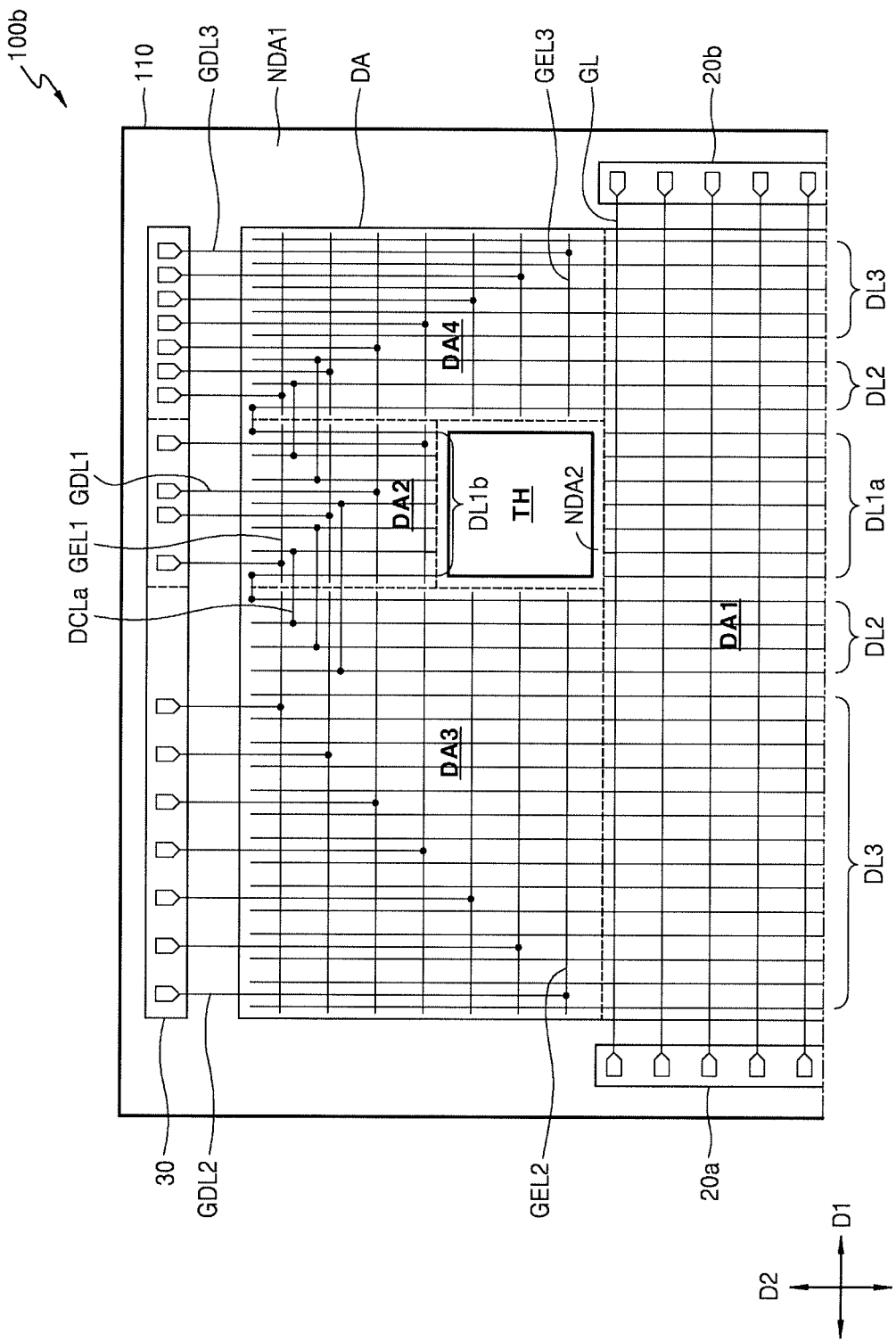
FIG. 9 illustrates another embodiment of a display apparatus.

FIG. 9 illustrates a magnified plan view of a portion of a display apparatus 100b according to another embodiment. Referring to FIG. 9, the display apparatus 100b is substantially identical to the display apparatus 100a in FIG. 3, except for locations of the data connecting lines DCLa.

As described above, the data connecting lines DCLa interconnect the second data lines DL2 and the second portions DL1b of the first data lines DL1, respectively. In FIG. 9, the data connecting lines DCLa may be in the second to fourth display areas DA2 to DA4. For example, at least some of the data connecting lines DCLa may extend across the border between the second display area DA2 and the third display area DA3. The remaining ones of the data connecting lines DCLa may extend across the border between the second display area DA2 and the fourth display area DA4. Therefore, the width of the upper portion of the edge non-display area NDA1 of the display apparatus 100a may be reduced.

Figure 10:
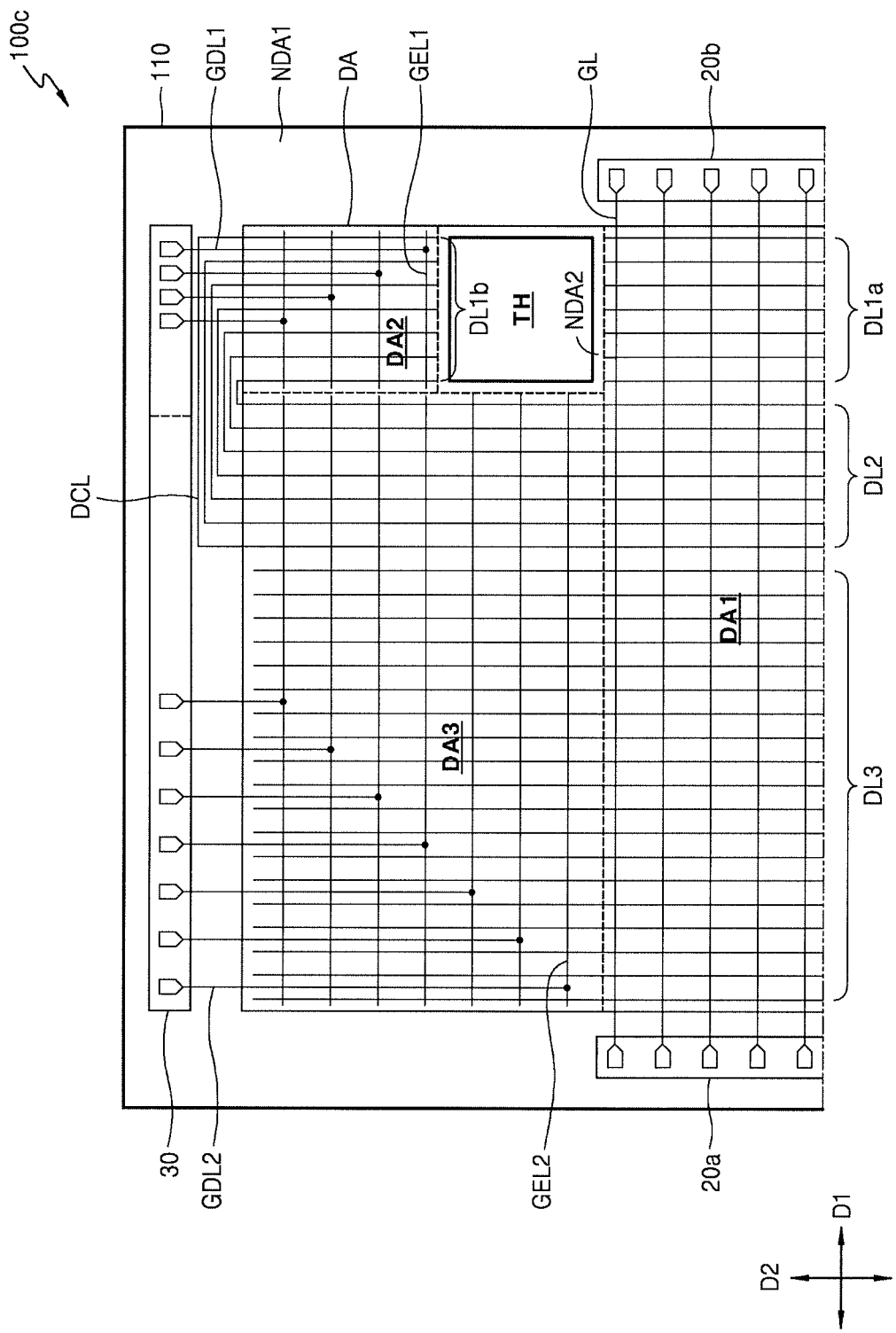
FIG. 10 illustrates another embodiment of a display apparatus.

FIG. 10 is a magnified plan view of a portion of a display apparatus 100c according to another embodiment. Referring to FIG. 10, a display apparatus 100c includes a through hole TH at a location different from that of the through hole TH of the display apparatus 100b in FIG. 3. The inner non-display area NDA2 is relocated to the right end of the display apparatus 100c, e.g., the inner non-display area NDA2 is directly adjacent to the edge non-display area NDA1.

Therefore, there is no display area DA to the right of the inner non-display area NDA2, and, as illustrated in FIG. 10, no fourth display area DA4 exists. All of the second portions DL1b of the first data lines DL1 are electrically connected to the second data lines DL2 in the third display area DA3. As shown in FIG. 10, the location of the through hole TH may be freely changed.

Figure 11:
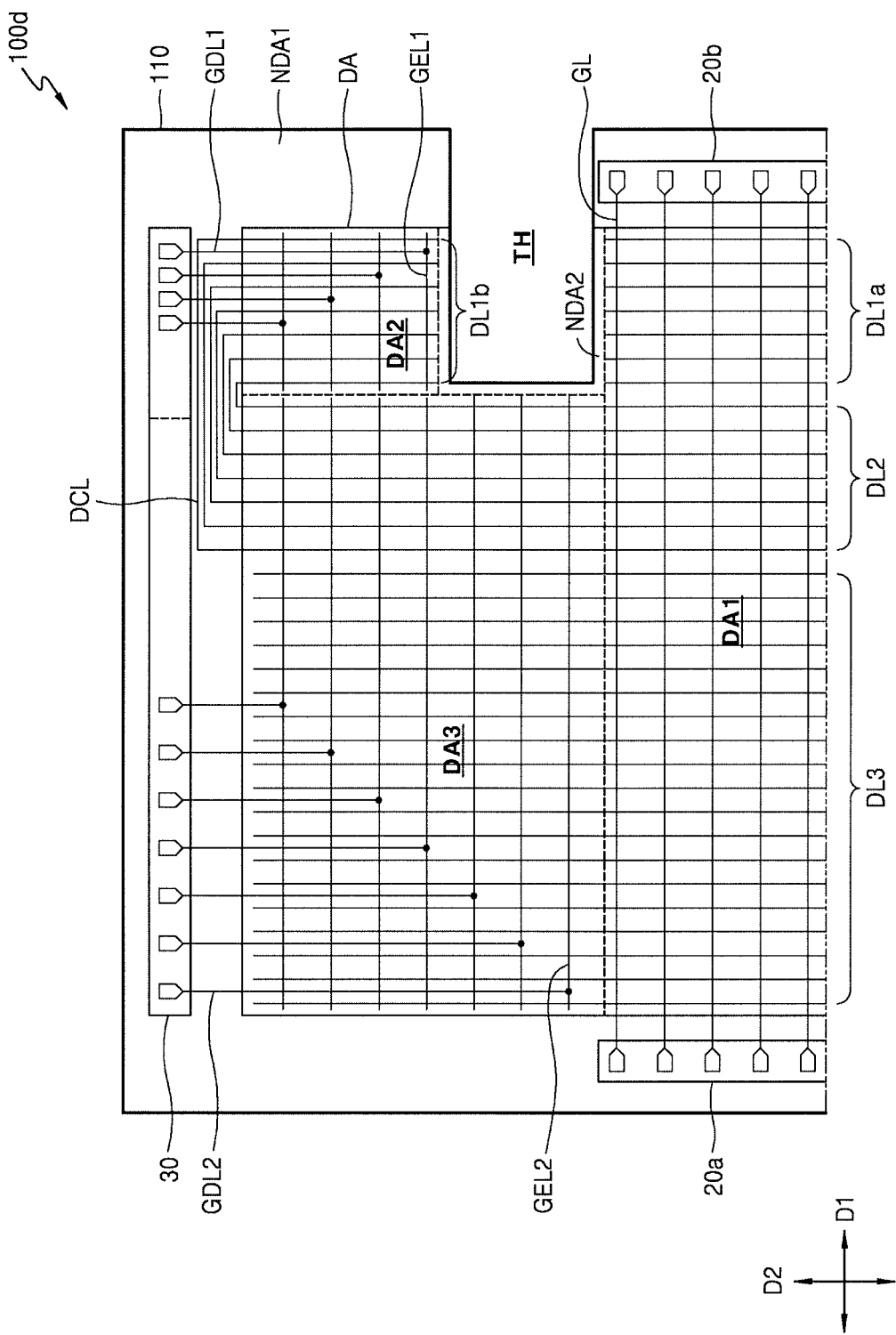
FIG. 11 illustrates another embodiment of a display apparatus.

FIG. 11 is a magnified plan view of a portion of a display apparatus 100d according to another embodiment. Referring to FIG. 11, a display apparatus 100d is substantially identical to the display apparatus 100c in FIG. 10, except that the through hole TH is a portion recessed from an edge of the substrate 110. The through hole TH is not inside the substrate 110 and may be integrated with edges of the substrate 110. As described above, location and shape of the through hole TH may be freely changed.

Figure 12:
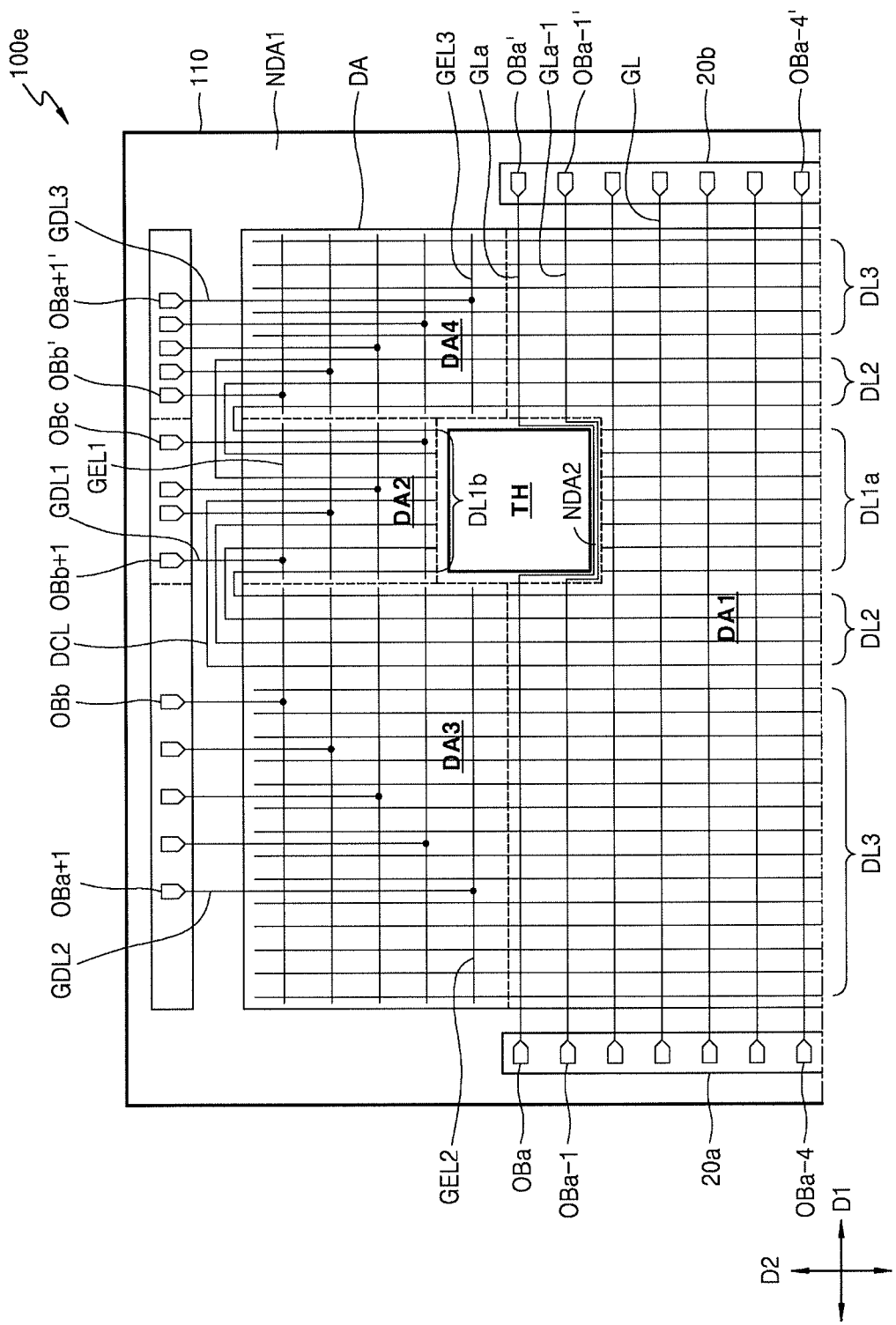
FIG. 12 illustrates another embodiment of a display apparatus.

FIG. 12 is a magnified plan view of a portion of a display apparatus 100e according to another embodiment. Referring to FIG. 12, at least some of the pixels PX at a side of the through hole TH in the first direction D1 (e.g., at a side of the through hole TH) are in the first display area DA1 of a display apparatus 100e. Some of the first pixels PX1 in the first display area DA1 are a side of the through hole TH in the first direction D1. The first pixels PX1 are connected to the gate lines GL connected to the first gate driver 20a and the third gate driver 20b. Gate lines GLa and GLa-1 connected to the some of the first pixels PX1 at a side of the through hole TH in the first direction D1 may not be straightly connected thereto due to the through hole TH. The gate lines GLa and GLa-1 extend around edges of the through hole TH and are connected to the some of the first pixels PX1 at a side of the through hole TH in the first direction D1. Portions of the GLa and GLa-1 are in the inner non-display area NDA2.

The bent gate lines GLa and GLa-1 are connected to the output buffers OBa and OBa-1 of the first gate driver 20a and the output buffers OBa' and OBa-1' of the third gate driver 20b. In one embodiment, either the first gate driver 20a or the third gate driver 20b may be omitted. If the third gate driver 20b is omitted, portions of the gate lines GLa and GLa-1 at the right side of the through hole TH are connected to the portions of gate lines GLa and GLa-1 at the left side of the through hole TH, via the portions of the gate lines GLa and GLa-1 that extend around edges of the through hole TH, and are in the inner non-display area NDA2.

At least some of the pixels PX at sides of the through hole TH may receive scanning signals from the first gate driver 20a and the third gate driver 20b. Furthermore, according to another embodiment, at least some of the pixels PX below the through hole TH may receive scanning signals from the second gate driver 30. According to another embodiment, at least some of the pixels PX at the left side or the right side of the through hole TH may receive scanning signals from the first gate driver 20a or the third gate driver 20b. Some other pixels PX at the left side or the right side of the through hole TH may receive scanning signals from the second gate driver 30.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, drivers, and other processing features described herein may be implemented in logic which, for example, may include hardware, software, or both. When implemented at least partially in hardware, the controllers, drivers, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, drivers, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, an inner non-display area NDA2 which includes a through hole TH does not include gate lines continuously extending in a row-wise direction or data lines continuously extending in a column-wise direction. Therefore, the difference between the size of the inner non-display area NDA2 and the size of the through hole TH may be significantly reduced. As a result, the overall area of the display area DA may become relatively large.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood that various changes in form and details may be made without departing from the spirit and scope of the embodiments set forth in the claims.

What is claimed is:

1. A display apparatus, comprising:
a substrate including:
   a display area including a first display area, a second display area, and a third display area, the third display area being adjacent to the second display area in a first direction and adjacent to the first display area in a second direction;
   an edge non-display area surrounding the display area;
   an inner non-display area between the first display area and the second display area and adjacent to the third display area in a direction opposite to the first direction; and
   a through hole that penetrates through the substrate in the inner non-display area of the display;
a display including:
   a plurality of pixels including first pixels in the first display area, second pixels in the second display area, and third pixels in the third display area;
   a plurality of gate lines extending in the first direction and connected to the first pixels and not connected to the second pixels;
   a plurality of first gate electrode lines extending in the first direction and connected to the second pixels and not connected to the first pixels; and a plurality of first gate driving lines extending in the second direction different from the first direction, the first gate driving lines respectively connected to the first gate electrode lines;

a first gate driver to output first scanning signals to the first pixels via the gate lines; and a second gate driver to output second scanning signals to the second pixels via the first gate driving lines and the first gate electrode lines.

2. The display apparatus as claimed in claim 1, wherein a first scanning period for the first gate driver to output the first scanning signals is shorter than a second scanning period for the second gate driver to output the second scanning signals.

3. The display apparatus as claimed in claim 1, wherein: within a single frame period, the second gate driver is to output the second scanning signals to the second pixels after the first gate driver outputs the first scanning signals to the first pixels.

4. The display apparatus as claimed in claim 1, wherein: the display includes a plurality of data lines extending in the second direction and connected to the first pixels and the second pixels, and the data lines include first data lines including first portions and second portions, the second portions being separated from second first portions by the through hole in the second direction and second data lines spaced from the through hole in the first direction and electrically and respectively connected to the second portions of the first data lines.

5. The display apparatus as claimed in claim 4, further comprising:

a plurality of data connecting lines connecting the second portions of the first data lines to the second data lines, respectively.

6. The display apparatus as claimed in claim 4, wherein the second pixels are connected to the second portions of the first data lines.

7. The display apparatus as claimed in claim 4, wherein: the data lines include third data lines spaced from the through hole in the first direction, and the second data lines are between the first data lines and the third data lines in the first direction.

8. The display apparatus as claimed in claim 1, wherein the inner non-display area is adjacent to the edge non-display area.

9. The display apparatus as claimed in claim 1, wherein: the display includes:

a plurality of second gate electrode lines extending in the first direction and connected to the third pixels; and a plurality of second gate driving lines extending in the second direction and respectively connected to the second gate electrode lines, the second gate driver is to output third scanning signals to the third pixels via the second gate driving lines and the second gate electrode lines.

10. The display apparatus as claimed in claim 9, wherein: within a single frame period, a time period for the second gate driver to output the third scanning signals to the third pixels is between a time period for the first gate driver to output the first scanning signals to the first pixels and a time period for the second gate driver to output the second scanning signals to the second pixels.

11. The display apparatus as claimed in claim 9, wherein: the display area includes a fourth display area adjacent to the first display area in the second direction, the second display area and the inner non-display area are between the third display area and the fourth display area in the first direction, and the pixels includes a plurality of fourth pixels in the fourth display area.

12. The display apparatus as claimed in claim 11, wherein: the display includes:

third gate electrode lines extending in the first direction and connected to the fourth pixels; and third gate electrode lines extending in the second direction and respectively connected to the third gate electrode lines, the second gate driver is to output fourth scanning signals to the fourth pixels via the third gate driving lines and the third gate electrode lines.

13. The display apparatus as claimed in claim 12, wherein a time period for the second gate driver to output the third scanning signals to the third pixels and a time period for the second gate driver to output the fourth scanning signals to the fourth pixels overlap each other.

14. The display apparatus as claimed in claim 1, wherein: the gate lines are directly connected to the first gate driver, and the first gate driving lines are directly connected to the second gate driver.

15. The display apparatus as claimed in claim 1, wherein: the first gate driver is at a side of the first display area in the first direction, and the second gate driver is at a side of the second display area in the second direction.

16. The display apparatus as claimed in claim 1, wherein a through hole is recessed from an edge of the substrate.

17. The display apparatus as claimed in claim 1, wherein each of the pixels includes a pixel circuit including at least one thin-film transistor and a storage capacitor; and a light emitter connected to the pixel circuit.

18. The display apparatus as claimed in claim 17, wherein the light emitter includes an organic light-emitting device.

19. A display apparatus, comprising:

a first pixel in a first row and a first column;

a second pixel in a second row and a second column, the second row being different from the first row and the second column being different from the first column; and a control line connected to the first pixel and the second pixel, wherein the control line is to transfer data signals to the first pixel and the second pixel based on respective first and second scan signals, wherein a first period of the first scan signal is shorter than a second period of the second scan signal, and wherein the first pixel receives the first scan signal every first period and the second pixel receives the second scan signal every second period such that a frame rate for displaying a first image by the second pixel is slower than a frame rate for displaying a second image by the first pixel.

20. The display apparatus as claimed in claim 19, wherein:

the first pixel is in a display area, and the second pixel is adjacent to a through hole in the display area.

21. The display apparatus as claimed in claim 20, wherein the through hole is in an interior portion of the display area.

22. The display apparatus as claimed in claim 19, wherein the control line includes two data lines connected by another line.

23. The display apparatus as claimed in claim 1, wherein:
the plurality of gate lines are only connected to the first pixels; and
the plurality of first gate electrode lines are only connected to the second pixels.

\* \* \* \* \*